(12) United States Patent
Okada

(10) Patent No.: US 6,628,176 B1
(45) Date of Patent: Sep. 30, 2003

(54) HIGH-FREQUENCY INPUT IMPEDANCE MATCHING CIRCUIT, HIGH-FREQUENCY OUTPUT IMPEDANCE MATCHING CIRCUIT AND SEMICONDUCTOR INTEGRATED CIRCUIT

(75) Inventor: Tohru Okada, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/517,538

(22) Filed: Mar. 2, 2000

(30) Foreign Application Priority Data

Apr. 27, 1999 (JP) .......................................... 11-120625

(51) Int. Cl.$^7$ ................................................ H03H 7/38
(52) U.S. Cl. ......................................... 333/32; 330/302
(58) Field of Search ............................. 333/32; 330/302

(56) References Cited

U.S. PATENT DOCUMENTS

| | | | | |
|---|---|---|---|---|
| 5,418,449 A | * | 5/1995 | Pataut et al. ................... | 324/95 |
| 5,530,922 A | * | 6/1996 | Nagode ........................ | 455/126 |
| 5,783,965 A | * | 7/1998 | Iwatsuki et al. .............. | 327/532 |
| 5,969,582 A | * | 10/1999 | Boesch et al. ................ | 333/129 |
| 6,075,414 A | * | 6/2000 | Nagaoka et al. ............. | 330/284 |
| 6,163,222 A | * | 12/2000 | Kobayashi ................... | 330/302 |
| 6,329,886 B1 | * | 12/2001 | Ogoro .......................... | 333/32 |

FOREIGN PATENT DOCUMENTS

| | | |
|---|---|---|
| JP | 58-162112 | 9/1983 |
| JP | 6-310916 | 11/1994 |
| JP | 7-240369 | 9/1995 |
| JP | 8-37433 | 2/1996 |

* cited by examiner

Primary Examiner—Benny Lee
Assistant Examiner—Stephen E. Jones
(74) Attorney, Agent, or Firm—Arent Fox Kintner Plotkin & Kahn

(57) ABSTRACT

A high-frequency input impedance matching circuit includes an inductor connected between an input of a transistor and an input terminal of the high-frequency input impedance matching circuit, a first capacitor having one end connected to the input terminal and another end connected to a ground, and a second capacitor connected to the inductor in parallel.

4 Claims, 18 Drawing Sheets

FIG. 9A
FIG. 9B
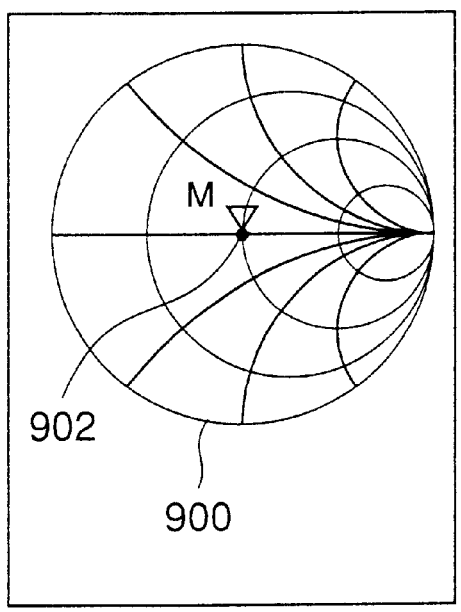
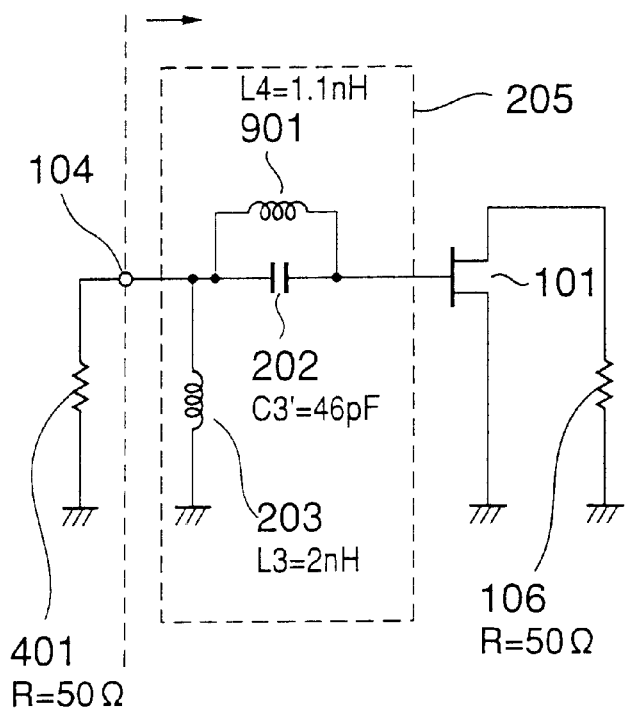

FIG. 16A
FIG. 16B
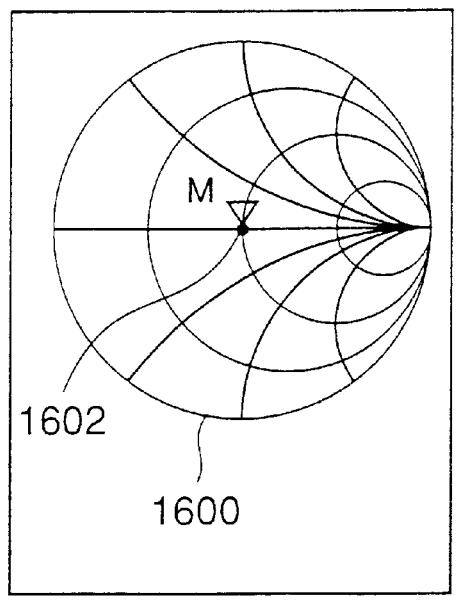
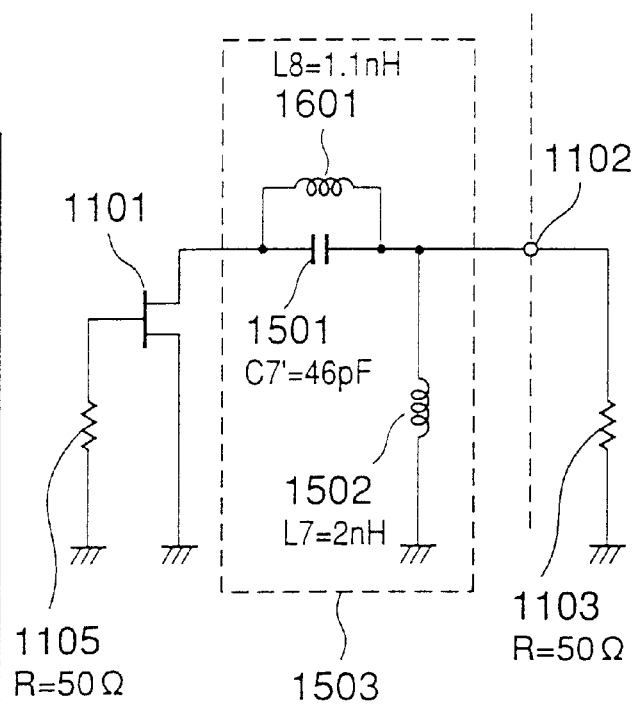

FIG. 17A
FIG. 17B
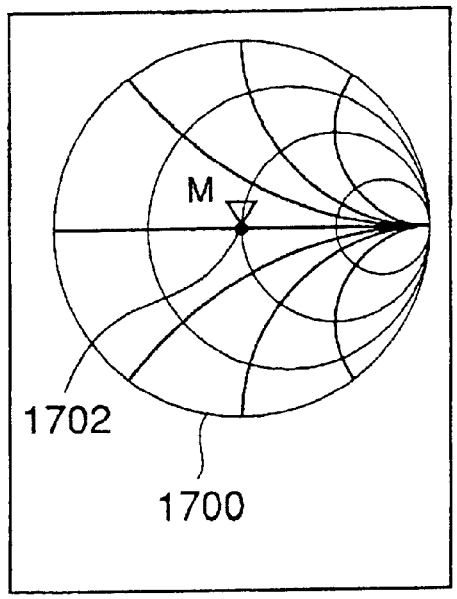
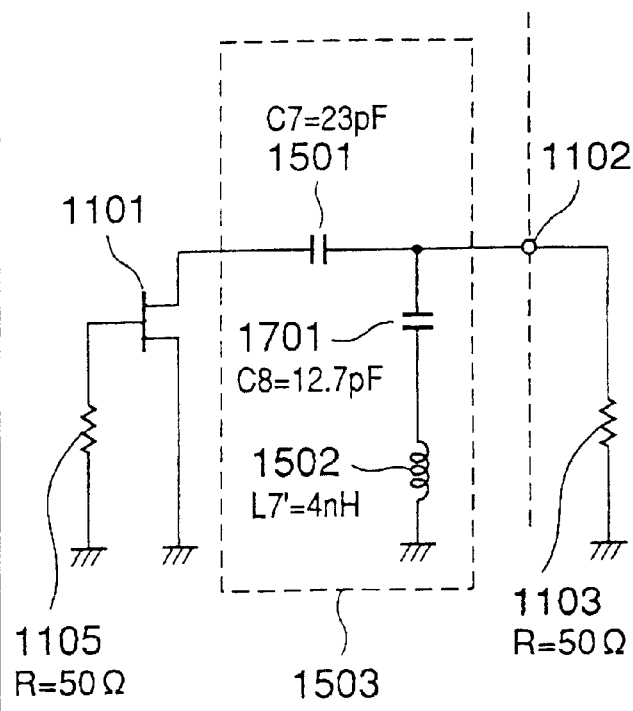

HIGH-FREQUENCY INPUT IMPEDANCE MATCHING CIRCUIT, HIGH-FREQUENCY OUTPUT IMPEDANCE MATCHING CIRCUIT AND SEMICONDUCTOR INTEGRATED CIRCUIT

BACKGROUND OF THE INVENTION

1. Field of the Invention

The present invention generally relates to a high-frequency semiconductor integrated circuit, and more particularly to a high-frequency input impedance matching circuit and a high-frequency output impedance matching circuit in which a high-frequency power loss in an inductor is reduced.

2. Description of the Related Art

Recently, use of mobile telephones has widely spread. There is a demand to reduce the area of a high-frequency circuit which is used in the mobile telephones. To meet this demand, the high-frequency circuit is integrated into a large scale integration circuit (LSI). It is necessary for the high-frequency circuit to match its input and output impedance to 50Ω so as to input and output a signal with high power efficiency.

FIG. 1 shows one type of a high-frequency input impedance matching circuit for a field effect transistor (FET) or a bipolar transistor. FIG. 2 shows another type of the high-frequency input impedance matching circuit.

A low pass filter (LPF) type high-frequency input impedance matching circuit as shown in FIG. 1 or a high pass filter (HPF) type high-frequency input impedance matching circuit as shown in FIG. 2 is generally used. In the LPF-type high-frequency input impedance matching circuit 105 as shown in FIG. 1, one terminal of an inductor 102 is connected to an input terminal of a transistor 101 and another terminal of the inductor 102 is connected to an input terminal 104. One terminal of a capacitor 103 is connected to the input terminal 104 and another terminal of the capacitor 103 is connected to a ground. An input signal is applied to the input terminal 104.

If the size of the transistor 101 is large, for example, an FET having a long gate or a bipolar transistor having a large emitter, the input impedance of the transistor is very low, for example, less than ten Ω. The high-frequency input impedance matching circuit 105 having the inductor 102 and the capacitor 103 as shown in FIG. 1 operates such that the input impedance of the input terminal 104 is equal to 50Ω.

On the other hand, in the HPF-type high-frequency input impedance matching circuit 205 as shown in FIG. 2, one terminal of a capacitor 202 is connected to the input terminal of the transistor 101 and another terminal of the capacitor 202 is connected to the input terminal 104. One terminal of an inductor 203 is connected to the input terminal 104 and another terminal of the inductor 203 is connected to the ground. An input signal is applied to the input terminal 104.

As mentioned above, if the size of the transistor 101 is large, the input impedance of the transistor is very low, for example, less than ten Ω. The high-frequency input impedance matching circuit 205 having the capacitor 202 and the inductor 203 as shown in FIG. 2 operates such that the input impedance of the input terminal 104 is equal to 50Ω.

Japanese Patent Application Number 57-45877 discloses a matching circuit for a microwave monolithic integration circuit (MMIC). In this application, a DC cut capacitor having a large capacitance is necessary. Therefore, to reduce the area of the DC cut capacitor in the MMIC, an improved impedance conversion circuit is utilized. The DC cut capacitor is included in the improved impedance conversion circuit to reduce the capacitance of the DC cut capacitor.

However, the prior art described above has the following problems.

One problem is that in the high-frequency input impedance matching circuit 105 as shown in FIG. 1, a power loss in the inductor connected to the gate of the FET 101 causes a degradation of characteristics of the high-frequency semiconductor circuit. FIG. 3 shows an equivalent circuit of the inductor 102. An inductor 301 shows an inductance component of the inductor 102 and a resistor 302 shows a series resistance component of the inductor 102.

In an MMIC, the inductor 102 is generally formed by a spiral inductor or a meander inductor. An inductor having a long length is generally necessary to form an inductor having a large inductance. The inductor having the long length also has the resistance component 302 having a high resistance. Furthermore, when a frequency of the input signal applied to the input terminal 104 is increased, the resistance of the resistance component 302 is also increased by a skin effect.

As a result, when the resistance of the resistance component 302 is higher than the input impedance of the FET 101, much of the high-frequency power supplied to the input terminal 104 is consumed by the series resistance component 302 in the inductor 102. This means that high-frequency power loss is increased. Therefore, in the high-frequency input impedance matching circuit, it is necessary to reduce the high-frequency power loss in the inductor which is connected to the FET 101 having the small input impedance.

Next, in the HPF-type high-frequency input impedance matching circuit 205 as shown in FIG. 2, a power loss in the inductor which is connected between one terminal of the capacitor 202 and the ground also causes a degradation of characteristics of the high-frequency semiconductor circuit.

In the HPF-type high-frequency input impedance matching circuit 205, the capacitor 202 is connected to the gate of the FET 101. The high frequency power loss in the capacitor which is used in the high-frequency circuit is generally lower than that of the inductor used in the high-frequency circuit. When the capacitor 202 has a large capacitance value, an impedance at a point 206 is almost the same value as that of the input impedance of the FET 101. Therefore, it is also necessary to reduce the high-frequency power loss in the inductor 203.

However, the inductor 203 causes the high-frequency power loss for the same reason as the LPF-type high-frequency input impedance matching circuit. Then, conventionally, the inductor 203 is formed outside the chip by a bonding wire, a package lead, a printed wire or a chip inductor.

When the inductor 203 is formed outside the chip, the following problem occurs. Some kinds of characteristics of the high-frequency circuit fluctuate according to the inductance of the inductor 203. Therefore, when the inductor 203 is formed outside the chip, it is difficult to consistently produce the high-frequency circuit with stable characteristics because the inductance has a different value for each inductor 203 formed outside the chip. When the frequency of the input signal applied to the input terminal 104 is increased, an inductor having a small inductance value is necessary. However, it is difficult to produce the inductor 203 having a small inductance value outside the chip with high-precision.

The problems for only the high-frequency input impedance matching circuits are described above. However, the high-frequency output impedance matching circuits also have the same problems as mentioned above.

SUMMARY OF THE INVENTION

It is a general object of the present invention to provide a high-frequency input impedance matching circuit, a high-frequency output impedance matching circuit and a semiconductor integrated circuit in which the above disadvantages are eliminated.

A more specific object of the present invention is to provide a high-frequency input impedance matching circuit and a high-frequency output impedance matching circuit in which the high-frequency power loss in an inductor is reduced.

The above objects of the present invention are achieved by a high-frequency input impedance matching circuit having an inductor which is connected between an input of a transistor and an input terminal of the high-frequency input impedance matching circuit, a first capacitor one end of which is connected to the input terminal and another end of which is connected to a ground and a second capacitor which is connected to the inductor in parallel.

According to the invention, the effective reactance of the inductor is increased by connecting the second capacitor to the inductor in parallel. Therefore, an inductor having a small inductance value can be used. As a result, the high-frequency power loss in the high-frequency input impedance matching circuit can be reduced because the inductor having a short length can be used. The high-frequency input impedance matching circuit according to the present invention can also operate such that the input impedance of the input terminal 104 is equal to 50Ω.

BRIEF DESCRIPTION OF THE DRAWINGS

Other objects, features and advantages of the present invention will become more apparent from the following detailed description when read in conjunction with the accompanying drawings, in which:

FIGS. 9A and 9B show the input impedance of an embodiment according to the present invention of the HPF-type high-frequency input impedance matching circuit, in which an inductor is connected to a capacitor in parallel, connected to the input of the FET;

FIGS. 16A and 16B show an output impedance of an embodiment according to the present invention of the HPF-type high-frequency output impedance matching circuit, in which an inductor is connected to a capacitor in parallel, connected to the output of the FET;

FIGS. 17A and 17B show the output impedance of another embodiment according to the present invention of the HPF-type high-frequency output impedance matching circuit, in which a capacitor is connected to an inductor in series, connected to the output of the FET;

DESCRIPTION OF THE PREFERRED EMBODIMENTS

A first embodiment according to the present invention will be explained.

Figure 4A:
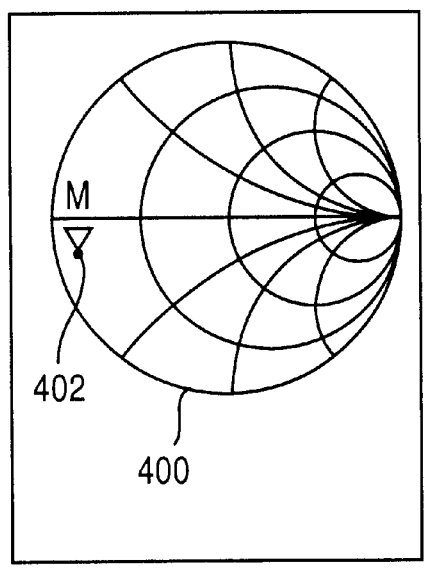
FIG. 4A shows an input impedance of an FET according to the prior art.
Figure 4B:
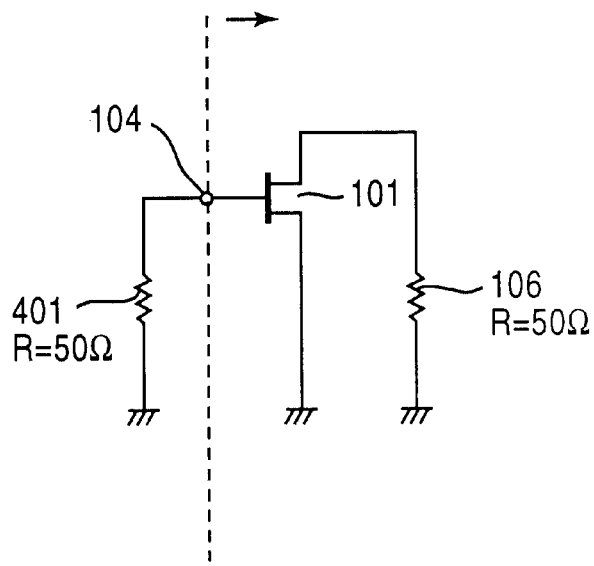
FIG. 4B shows a high-frequency circuit according to the prior art.

FIG. 4A shows an input impedance on a Smith chart 400 of a high-frequency circuit as shown in FIG. 4B having the FET 101 and a resistor 401 connected to an input terminal 104 of the FET 101. A resistance of the resistor 401 is 50Ω. A point M 402 on the Smith chart 400 shows the input impedance of the FET 101 at a frequency of 1 GHz. Hereinafter, an impedance at the frequency of 1 GHz is shown on the Smith chart. For example, a real part of a complex input impedance of the FET 101 is 3Ω and an imaginary part of the complex input impedance of the FET 101 is −5Ω.

Figure 1:
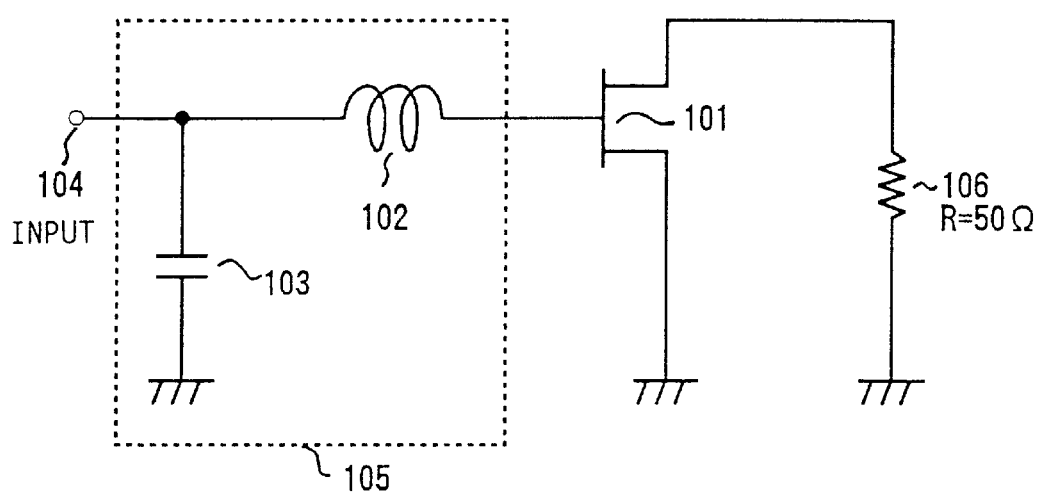
FIG. 1 shows a LPF-type high-frequency input impedance matching circuit according to the prior art.
Figure 5A:
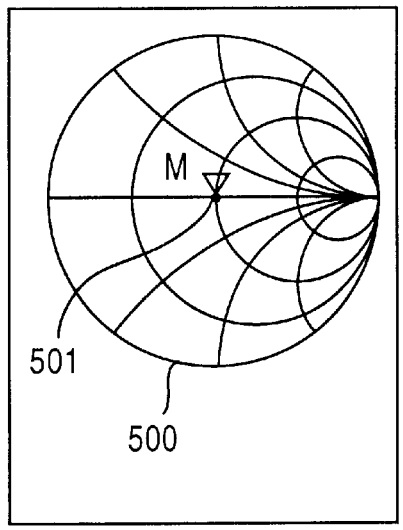
FIGS. 5A and 5B show an input impedance of the LPF-type high-frequency input impedance matching circuit according to the prior art connected to an input of the FET.
Figure 5B:
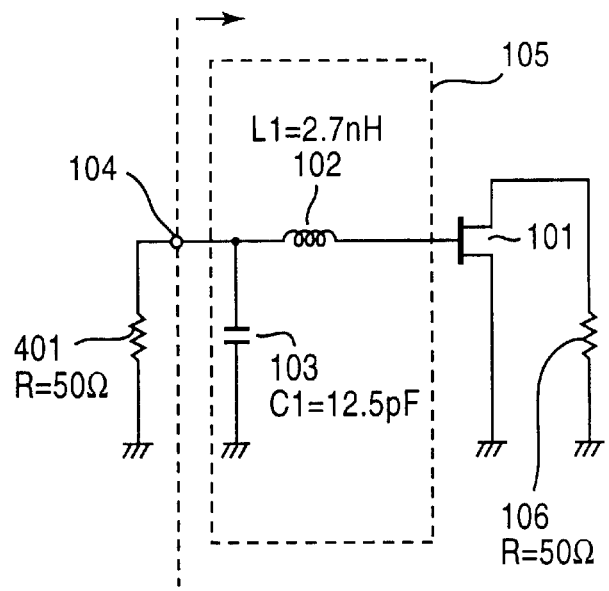

FIG. 5B shows a high-frequency input impedance matching circuit 105 according to the prior art, which is connected between a gate of the FET 101 and the input terminal 104. The high-frequency input impedance matching circuit 105 is the same circuit as the LPF-type high-frequency input impedance matching circuit 105 as shown in FIG. 1. The position of the input impedance of the input terminal 104 on the Smith chart moves from the point M 402 as shown in FIG. 4A to the point M 501 as shown in FIG. 5A, which point M 501 shows 50Ω on the Smith chart, when the inductance L1 of the inductor 102 is set equal to 2.7 nH and the capacitance C1 of the capacitor 103 is set equal to 12.5 pF in the input impedance matching circuit 105, for example. This means that the input impedance of the FET 101 can be matched to 50Ω by adding the input impedance matching circuit 105.

Figures 6A, 6B:
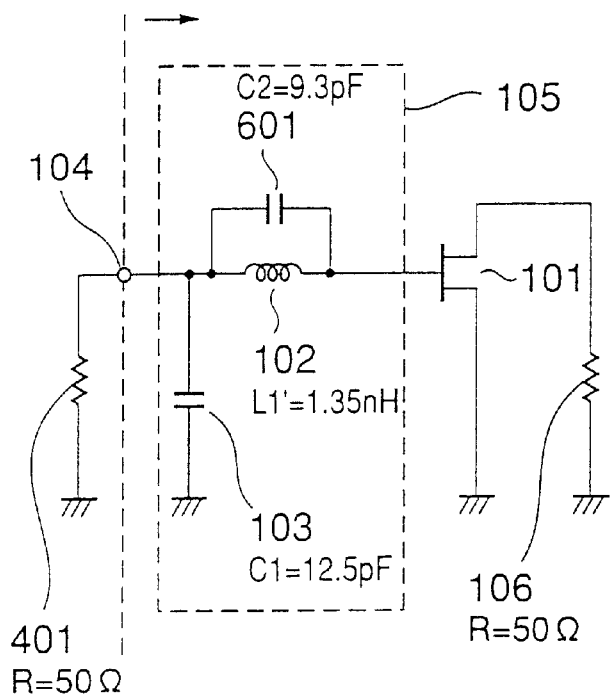
FIGS. 6A and 6B show an input impedance of an embodiment according to the present invention of the LPF-type high-frequency input impedance matching circuit, in which a capacitor is connected to an inductor in parallel, connected to the input of the FET.

FIG. 6A shows an input impedance of the first embodiment of the LPF-type high-frequency input impedance matching circuit as shown in FIG. 6B. In the LPF-type high-frequency input impedance matching circuit 105 as shown in FIG. 6B, a capacitor 601 is connected to the inductor 102 in parallel as compared with the LPF-type high-frequency input impedance matching circuit 105 as shown in FIG. 5B.

In FIG. 5B, an impedance of the inductor 102 having the inductance L1 is as follows;

$$j\omega L1, \quad (1)$$

where ω is an angular frequency.

On the other hand, in FIG. 6B, a parallel impedance of the inductor 102 having the inductance L1' and the capacitor 601 having a capacitance C2 is as follows;

$$j\omega L1'/(1-\omega^2 L1'C2). \quad (2)$$

Let the expression (1) be equal to the expression (2), $$L1=L1'/(1-\omega^2 L1'C2). \quad (3)$$

Therefore, $$L1'=L1/(1+\omega^2 L1C2). \quad (4)$$

The expression (4) means that the inductance L1' of the inductor 102 can be reduced by keeping the parallel impedance of the inductor 102 having the inductance L1' and the capacitor 601 having the capacitance C2 equal to the impedance of the inductor having the inductance L1 as shown in FIG. 5B. When the capacitance C2 of the capacitor 601 is selected to be 9.3 pF, the inductance L1' of the inductor 102 is 1.35 nH to keep the parallel impedance of the inductor 102 having the inductance L1' and the capacitor 601 having the capacitance C2 equal to the impedance of the inductor 102 having the inductance of L1=2.7 nH.

The position of the point M 602 on the Smith chart 600 shows the input impedance of the input terminal 104 of the high-frequency input impedance matching circuit 105 as shown in FIG. 6B when the capacitance C2 of the capacitor 601 is equal to 9.3 pF and the inductance L1' of the inductor 102 is equal to 1.35 nH. A position where the point M 602 is placed on the Smith chart 600 and the position where the point M 501 is placed on the Smith chart 500 are the same. This means that the impedance of the point M 602 and the impedance of the point M 501 are the same. Therefore, it is possible to reduce the inductance of the inductor 102 from 2.7 nH to 1.35 nH by connecting the capacitor 601 to the inductor 102 in parallel without changing the input impedance of the input terminal 104 of the high-frequency input impedance matching circuit 105 as shown in FIG. 6B from that of the high-frequency input impedance matching circuit 105 as shown in FIG. 5B.

This means that it is possible to use the inductor 102 having a small inductance value because the effective reactance of the inductor 102 is increased by connecting the capacitor 601 to the inductor 102 in parallel. As a result, the series resistance component of the inductor 102 can be reduced because the inductor having a short length can be used. Therefore, the high-frequency input impedance matching circuit 105 is achieved, in which the high-frequency power loss in the inductor 102 is reduced.

Next, a second embodiment according to the present invention will be explained.

Figure 7A:
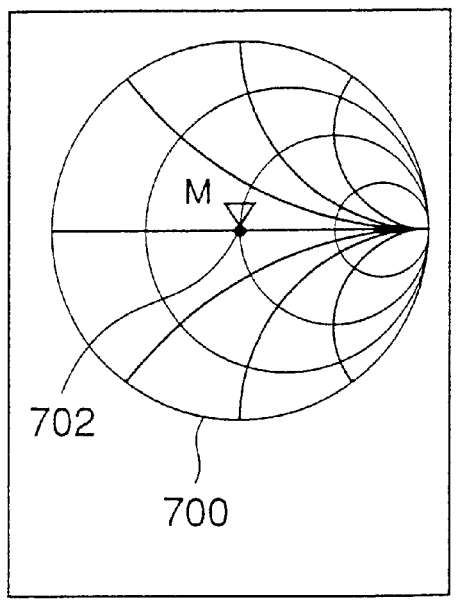
FIGS. 7A and 7B show the input impedance of another embodiment according to the present invention of the LPF-type high-frequency input impedance matching circuit, in which an inductor is connected to a capacitor in series, connected to the input of the FET.
Figure 7B:
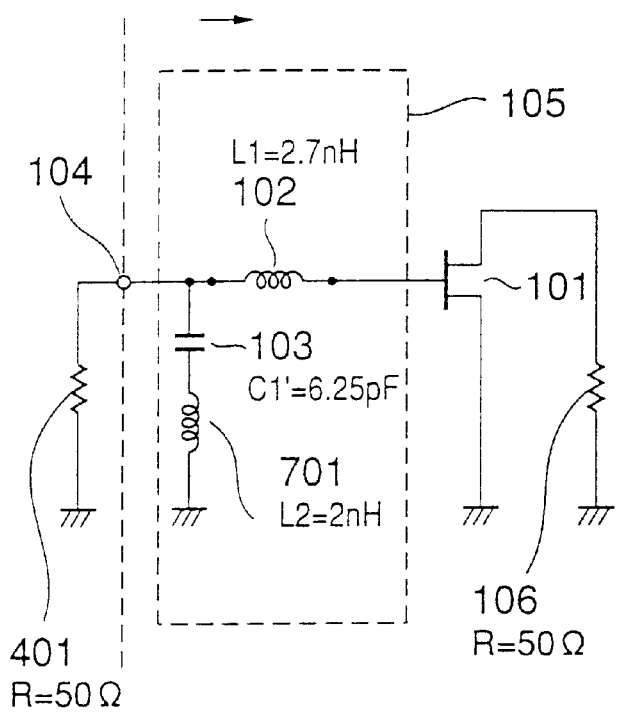

FIG. 7A shows an input impedance of the embodiment of the LPF-type high-frequency input impedance matching circuit as shown in FIG. 7B. In the LPF-type high-frequency input impedance matching circuit 105 as shown in FIG. 7B, an inductor 701 is connected to the capacitor 103 in serial as compared with the LPF-type high-frequency input impedance matching circuit 105 as shown in FIG. 5B.

In FIG. 5B, an impedance of the capacitor 103 having the capacitance C1 is as follows;

$$1/j\omega C1. \quad (5)$$

On the other hand, in FIG. 7B, a serial impedance of the inductor 701 having the inductance L2 and the capacitor 103 having a capacitance C1' is as follows;

$$j\omega L2+1/j\omega C1'. \quad (6)$$

Let the expression (5) be equal to the expression (6), $$C1'=C1/(1+\omega^2 L2C1). \quad (7)$$

The expression (7) means that the capacitance of the capacitor 103 can be reduced while keeping the serial impedance of the inductor 701 having the inductance L2 and the capacitor 103 having a capacitance C1' equal to the impedance of the capacitor having the capacitance C1 as shown in FIG. 5B. When the inductance L2 of the inductor 701 is selected to be 2 nH, the capacitance C1' of the capacitor 103 is 6.25 pF to keep the serial impedance of the inductor 701 having the inductance L2 and the capacitor 103 having a capacitance C1' equal to the impedance of the capacitor 103 having the capacitance of 12.5 pF.

The position of the point M 702 on the Smith chart 700 shows the input impedance of the input terminal 104 of the high-frequency input impedance matching circuit 105 as shown in FIG. 7B when the inductance L2 of the inductor 701 is equal to 2 nH and the capacitance C1' of the capacitor 103 is equal to 6.25 pF. A position where the point M 702 is placed on the Smith chart 700 as shown in FIG. 7A and the position where the point M 501 is placed on the Smith chart 500 as shown in FIG. 5B are the same. This means that the impedance of the point M 702 and the impedance of the point M 501 are the same. Therefore, it is possible to reduce the capacitance of the capacitor 103 from 12.5 pF to 6.25 pF by connecting the inductor 701 to the capacitor 103 in serial without changing the input impedance of the input terminal 104 of the high-frequency input impedance matching circuit 105 as shown in FIG. 7B from that of the high-frequency input impedance matching circuit 105 as shown in FIG. 5B.

This means that it is possible to use the capacitor 103 having a small capacitance value because the effective reactance of the capacitor 103 is increased by connecting the inductor 701 to the capacitor 103 in serial. Therefore, the high-frequency input impedance matching circuit 105 is achieved, in which the area of the capacitor 103 is reduced. As a result, it is possible to provide the inductor outside the chip to reduce the high-frequency power loss in the inductor 701 and the total area of the chip can be reduced.

In FIG. 7B, the same effect can be obtained if one end of the inductor 701 is connected to the input terminal 104, one end of the capacitor 103 is connected to the ground and another end of the inductor 701 is connected to another end of the capacitor 103.

Next, a third embodiment according to the present invention will be explained.

Figure 2:
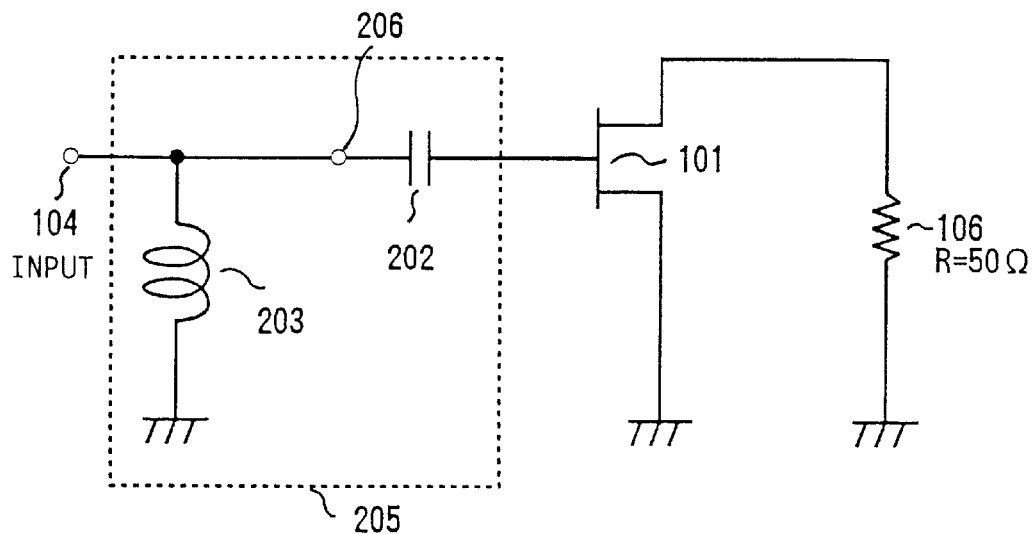
FIG. 2 shows a HPF-type high-frequency input impedance matching circuit according to the prior art.
Figure 3:
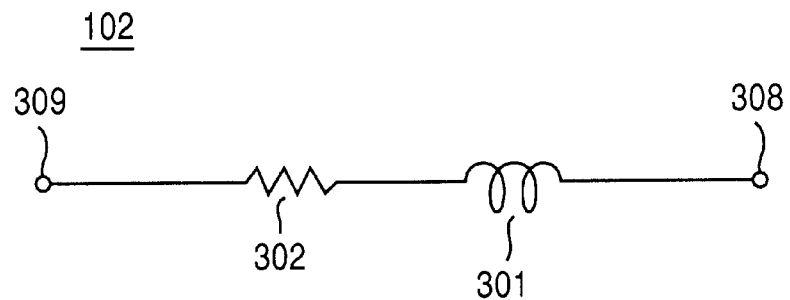
FIG. 3 shows an equivalent circuit of an inductor according to the prior art.
Figure 8A:
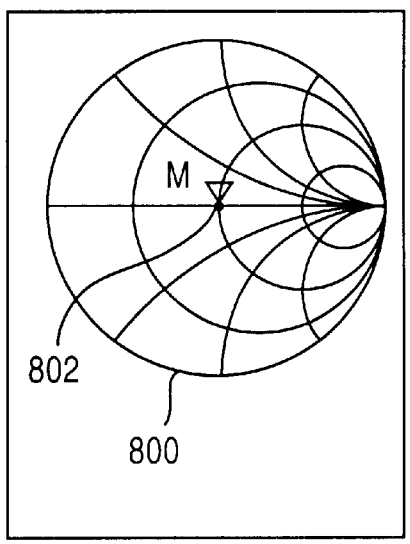
FIGS. 8A and 8B show an input impedance of the HPF-type high-frequency input impedance matching circuit according to the prior art connected to an input of the FET.
Figure 8B:
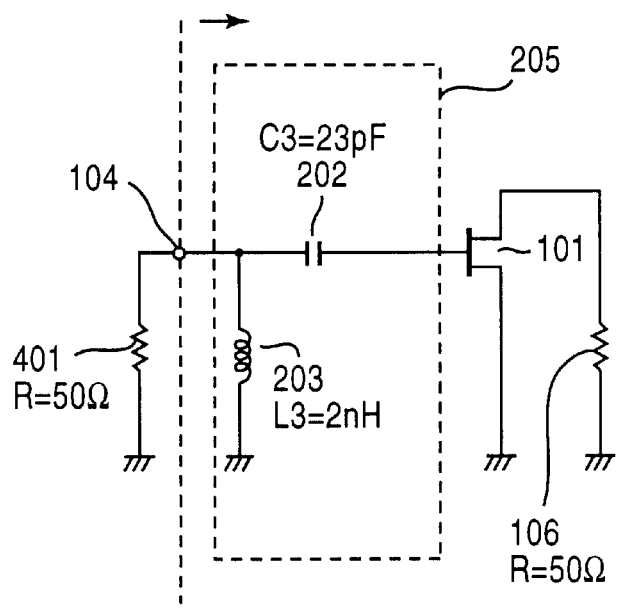

FIG. 8B shows the high-frequency input impedance matching circuit 205 according to the prior art, which is connected between the gate of the FET 101 and the input terminal 104. The high-frequency input impedance matching circuit 205 is the same circuit as the HPF-type high-frequency input impedance matching circuit 205 as shown in FIG. 2. The position of the input impedance of the input terminal 104 on the Smith chart moves from the point M 402 as shown in FIG. 4A to the point M 802 as shown in FIG. 8A, which point M 802 shows 50Ω on the Smith chart 800, when an inductance L3 of the inductor 203 is set equal to 2 nH and a capacitance C3 of the capacitor 202 is set equal to 23 pF in the input impedance matching circuit 205, for example. This means that the input impedance of the FET 101 can be matched to 50Ω by connecting the input impedance matching circuit 205.

FIG. 9A shows an input impedance of the embodiment of the HPF-type high-frequency input impedance matching circuit 205 as shown in FIG. 9B. In the HPF-type high-frequency input impedance matching circuit 205 as shown in FIG. 9B, an inductor 901 is connected to the capacitor 202 in parallel as compared with the HPF-type high-frequency input impedance matching circuit 205 as shown in FIG. 8B.

In FIG. 8B, an impedance of the capacitor 202 having the capacitance C3 is as follows;

$$1/j\omega C3. \tag{8}$$

On the other hand, in FIG. 9B, a parallel impedance of the capacitor 202 having the capacitance C3' and the inductor 901 having the inductance L4 is as follows;

$$1/(1/j\omega L4 + j\omega C3'). \tag{9}$$

Let the expression (8) be equal to the expression (9), $$C3' = C3 + (1/\omega^2 L4). \tag{10}$$

The expression (10) means that the capacitance C3' of the capacitor 202 can be increased by keeping the parallel impedance of the capacitor 202 having the capacitance C3' and the inductor 901 having the inductance L4 equal to the impedance of the capacitor having the capacitance C3 as shown in FIG. 8B. When the inductance L4 of the inductor 901 is selected to be 1.1 nH, the capacitance C3' of the capacitor 202 is 46 pF to keep the parallel impedance of the capacitor 202 having the capacitance C3' and the inductor 901 having the inductance L4 equal to the impedance of the capacitor in FIG. 8B having the capacitance C3 of 23 pF.

The position of the point M 902 on the Smith chart 900 shows the input impedance of the input terminal 104 of the high-frequency input impedance matching circuit 205 as shown in FIG. 9B when the inductance L4 of the inductor 901 is equal to 1.1 nH and the capacitance C3' of the capacitor 202 is equal to 46 pF. A position where the point M 902 is placed on the Smith chart 900 and the position where the point M 802 is placed on the Smith chart 800 are the same. This means that the impedance of the point M 902 and the impedance of the point M 802 are the same. Therefore, it is possible to increase the capacitance of the capacitor 202 from 23 pF to 46 pF by connecting the inductor 901 to the capacitor 202 in parallel without changing the input impedance of the input terminal 104 of the high-frequency input impedance matching circuit 205 as shown in FIG. 9B from that of the high-frequency input impedance matching circuit 205 as shown in FIG. 8B.

This means that it is possible to use the capacitor 202 having a large capacitance value because the effective reactance of the capacitor 202 is reduced by connecting the inductor 901 to the capacitor 202 in parallel. Therefore, the high-frequency input impedance matching circuit 205 is achieved, in which the fluctuation of the characteristics of the high-frequency circuit caused by the variation of the capacitance C3' of the capacitor 202 is reduced.

Next, a fourth embodiment according to the present invention will be explained.

Figure 10A:
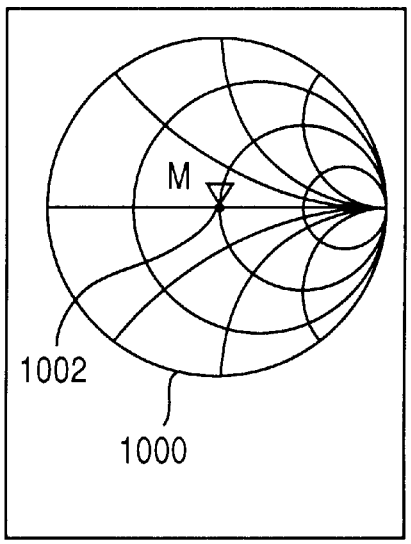
FIGS. 10A and 10B show the input impedance of another embodiment according to the present invention of the HPF-type high-frequency input impedance matching circuit, in which a capacitor is connected to an inductor in series, connected to the input of the FET.
Figure 10B:
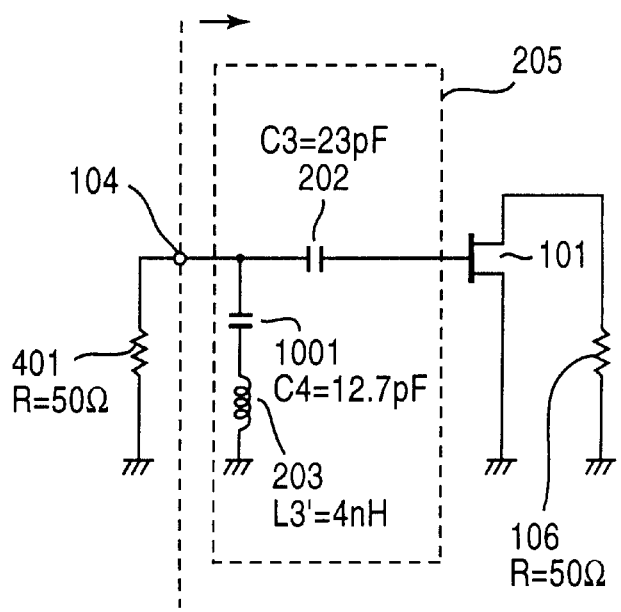

FIG. 10A shows an input impedance of the embodiment of the HPF-type high-frequency input impedance matching circuit as shown in FIG. 10B. In the HPF-type high-frequency input impedance matching circuit 205 as shown in FIG. 10B, the capacitor 1001 is connected to the inductor 203 in serial as compared with the HPF-type high-frequency input impedance matching circuit 205 as shown in FIG. 8B.

In FIG. 8B, an impedance of the inductor 203 having the inductance L3 is as follows;

$$j\omega L3. \tag{11}$$

On the other hand, in FIG. 10B, a serial impedance of the inductor 203 having the inductance L3' and the capacitor 1001 having a capacitance C4 is as follows;

$$j\omega L3' + 1/j\omega C4. \tag{12}$$

Let the expression (11) be equal to the expression (12), $$L3' = L3 + 1/\omega^2 C4. \tag{13}$$

The expression (13) means that the inductance of the inductor 203 can be increased by keeping the serial impedance of the inductor 203 having the inductance L3' and the capacitor 1001 having a capacitance C4 equal to the impedance of the inductor having the inductance L3 as shown in FIG. 8B.

When the capacitance C4 of the capacitor 1001 is selected to be 12.7 pF, the inductance L3' of the inductor 203 is 4 nH to keep the serial impedance of the inductor 203 having the inductance L3' and the capacitor 1001 having a capacitance C4 equal to the impedance of the inductor having the inductance L3 of 2 nH.

The position of the point M 1002 on the Smith chart 1000 shows the input impedance of the input terminal 104 of the high-frequency input impedance matching circuit 205 as shown in FIG. 10B when the inductance L3' of the inductor 203 is equal to 4 nH and the capacitance C4 of the capacitor 1001 is equal to 12.7 pF. A position where the point M 1002 is placed on the Smith chart 1000 as shown in FIG. 10A and the position where the point M 802 is placed on the Smith chart 800 as shown in FIG. 8A are the same. This means that the impedance of the point M 1002 and the impedance of the point M 802 are the same. Therefore, it is possible to increase the inductance of the inductor 203 from 2 nH to 4 nH by connecting the capacitor 1001 to the inductor 203 in serial without changing the input impedance of the input terminal 104 of the high-frequency input impedance matching circuit 205 as shown in FIG. 10B from that of the high-frequency input impedance matching circuit 205 as shown in FIG. 8B.

This means that it is possible to use the inductor 203 having a large inductance value because the effective reactance of the inductor 203 is reduced by connecting the capacitor 1001 to the inductor 203 in serial. As a result, it is possible to place the low-loss inductor 203 outside the chip. Therefore, the high-frequency input impedance matching circuit 205 is achieved, in which the fluctuation of the characteristics of the high-frequency circuit caused by the variation of the inductance L3' of the inductor 203 is reduced.

In FIG. 10B, the same effect can be obtained if one end of the inductor 203 is connected to the input terminal 104, one end of the capacitor 1001 is connected to the ground and another end of the inductor 203 is connected to another end of the capacitor 1001.

Next, a high-frequency output impedance matching circuit will be explained.

A fifth embodiment according to the present invention will be explained.

Figure 11A:
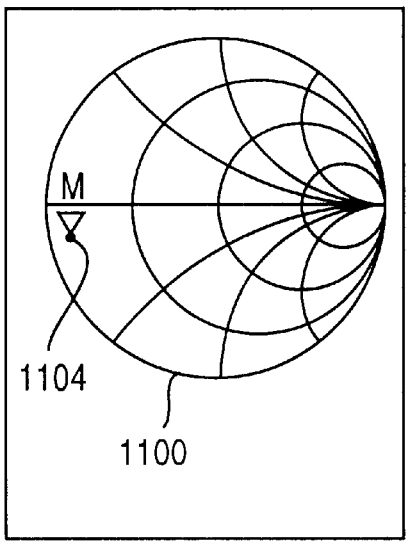
FIGS. 11A and 11B show an output impedance of an FET according to the prior art.
Figure 11B:
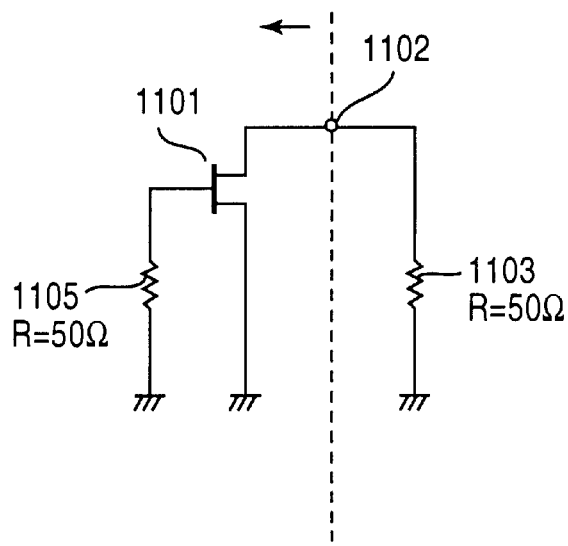

FIG. 11A shows an output impedance on a Smith chart 1100 of a high-frequency circuit as shown in FIG. 11B having an FET 1101 and a resistor 1103 connected to an output terminal 1102 of the FET 1101. A resistance of the resistor 1103 is 50Ω. A point M 1104 on the Smith chart 1100 shows the output impedance of the FET 1101 at a frequency of 1 GHz. For example, a real part of a complex output impedance of the FET 1101 is 3Ω and an imaginary part of the complex output impedance of the FET 1101 is −5Ω.

Figure 12A:
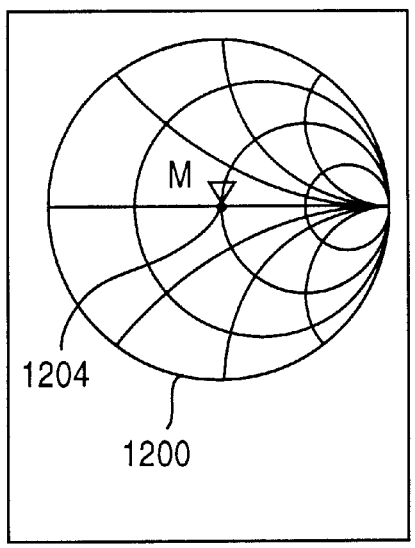
FIGS. 12A and 12B show an output impedance of the LPF-type high-frequency output impedance matching circuit according to the prior art connected to an output of the FET.
Figure 12B:
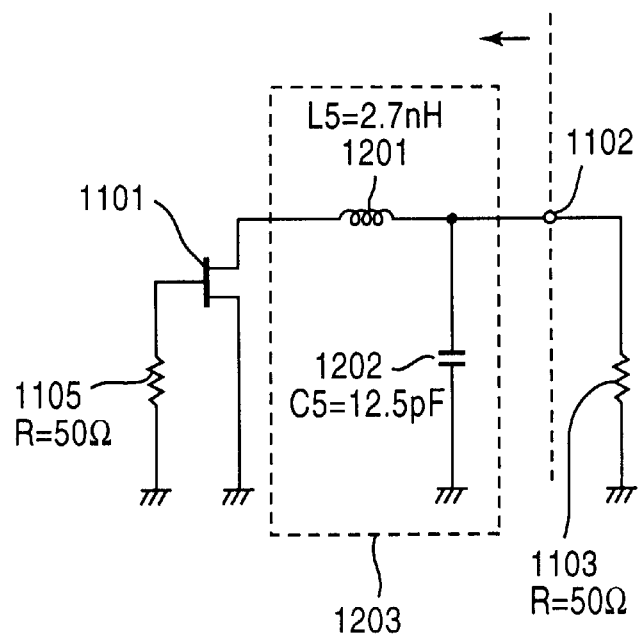

FIG. 12B shows an LPF-type high-frequency output impedance matching circuit 1203 according to the prior art, which is connected between a drain of the FET 1101 and the output terminal 1102. The position of the output impedance of the output terminal 1102 on the Smith chart moves from the point M 1104 as shown in FIG. 11A to the point M 1204 as shown in FIG. 12A, which point M 1204 shows 50Ω on the Smith chart, when an inductance L5 of the inductor 1201 is set equal to 2.7 nH and a capacitance C5 of the capacitor 1202 is set equal to 12.5 pF in the output impedance matching circuit 1203, for example. This means that the output impedance of the FET 1101 can be matched to 50Ω by connecting the output impedance matching circuit 1203.

Figure 13A:
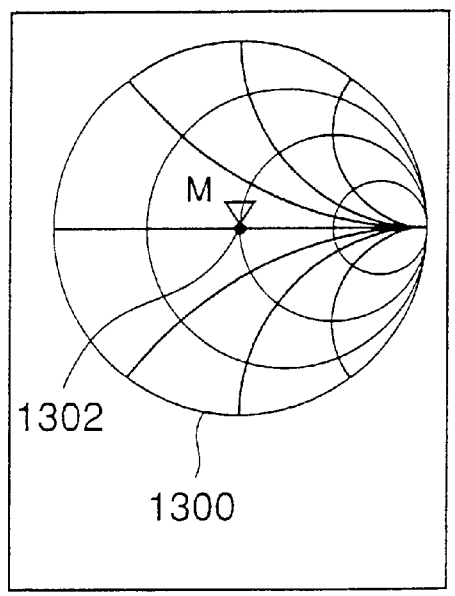
FIGS. 13A and 13B show an output impedance of an embodiment according to the present invention of the LPF-type high-frequency output impedance matching circuit, in which a capacitor is connected to an inductor in parallel, connected to the output of the FET.
Figure 13B:
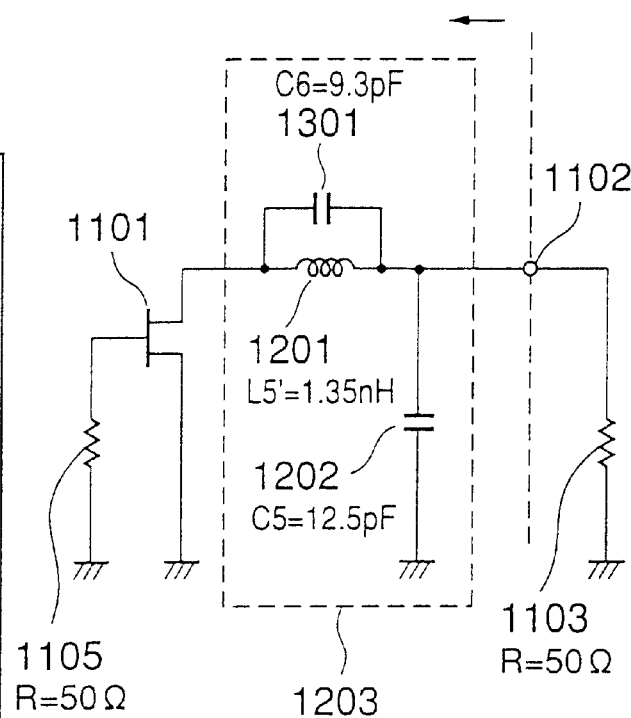

FIG. 13A shows an output impedance of the embodiment of the LPF-type high-frequency output impedance matching circuit as shown in FIG. 13B. In the LPF-type high-frequency output impedance matching circuit 1203 as shown in FIG. 13B, a capacitor 1301 is connected to the inductor 1201 in parallel as compared with the LPF-type high-frequency output impedance matching circuit 1203 as shown in FIG. 12B.

When the capacitance C6 of the capacitor 1301 is selected to be 9.3 pF, the inductance L5' of the inductor 1201 is 1.35 nH to keep the parallel impedance of the inductor 1201 having the inductance L5' and the capacitor 1301 having the capacitance C6 equal to the impedance of the inductor 1201 having the inductance L5 of 2.7 nH.

The position of the point M 1302 on the Smith chart 1300 shows the output impedance of the output terminal 1102 of the high-frequency output impedance matching circuit 1203 as shown in FIG. 13B when the capacitance C6 of the capacitor 1301 is equal to 9.3 pF and the inductance L5' of the inductor 1201 is equal to 1.35 nH. A position where the point M 1302 is placed on the Smith chart 1300 and the position where the point M 1204 is placed on the Smith chart 1200 are the same. This means that the impedance of the point M 1302 and the impedance of the point M 1204 are the same. Therefore, it is possible to reduce the inductance L5' of the inductor 1201 from 2.7 nH to 1.35 nH by connecting the capacitor 1301 to the inductor 1201 in parallel without changing the output impedance of the output terminal 1102 of the high-frequency output impedance matching circuit 1203 as shown in FIG. 13B from that of the high-frequency output impedance matching circuit 1203 as shown in FIG. 12B.

This means that it is possible to use the inductor 1201 having a small inductance value because the effective reactance of the inductor 1201 is increased by connecting the capacitor 1301 to the inductor 1201 in parallel. As a result, the series resistance component of the inductor 1201 can be reduced because the inductor having a short length can be used. Therefore, the high-frequency output impedance matching circuit 1203 is achieved, in which the high-frequency power loss in the inductor 1201 is reduced.

Next, a sixth embodiment according to the present invention will be explained.

Figure 14A:
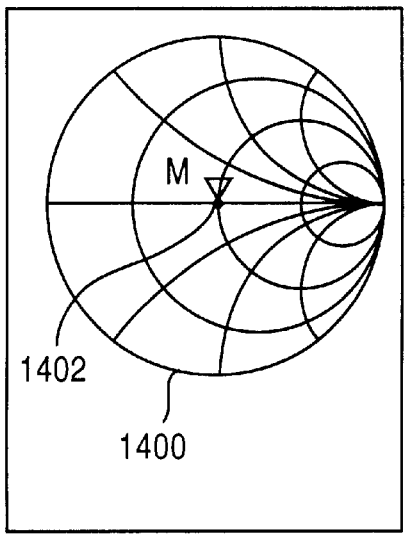
FIGS. 14A and 14B show the output impedance of another embodiment according to the present invention of the LPF-type high-frequency output impedance matching circuit, in which an inductor is connected to a capacitor in series, connected to the input of the FET.
Figure 14B:
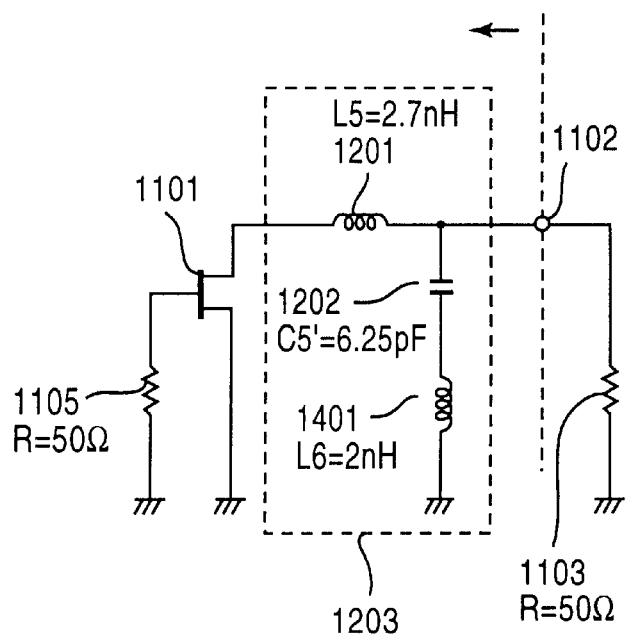

FIG. 14A shows an input impedance of the embodiment of the LPF-type high-frequency output impedance matching circuit as shown in FIG. 14B. In the LPF-type high-frequency output impedance matching circuit 1203 as shown in FIG. 14B, an inductor 1401 is connected to the capacitor 1202 in serial as compared with the LPF-type high-frequency output impedance matching circuit 1203 as shown in FIG. 12B.

When the inductance L6 of the inductor 1401 is selected to be 2 nH, the capacitance C5' of the capacitor 1202 is 6.25 pF to keep the serial impedance of the inductor 1401 having the inductance L6 and the capacitor 1202 having a capacitance C5' equal to the impedance of the capacitor 1202 having the capacitance of 12.5 pF.

The position of the point M 1402 on the Smith chart 1400 shows the output impedance of the output terminal 1102 of the high-frequency output impedance matching circuit 1203 as shown in FIG. 14B when the inductance L6 of the inductor 1401 is equal to 2 nH and the capacitance C5' of the capacitor 1202 is equal to 6.25 pF. A position where the point M 1402 is placed on the Smith chart 1400 as shown in FIG. 14A and the position where the point M 1204 is placed on the Smith chart 1200 as shown in FIG. 12A are the same. This means that the impedance of the point M 1402 and the impedance of the point M 1204 are the same. Therefore, it is possible to reduce the capacitance of the capacitor 1202 from 12.5 pF to 6.25 pF by connecting the inductor 1401 to the capacitor 1202 in serial without changing the output impedance of the output terminal 1102 of the high-frequency output impedance matching circuit 1203 as shown in FIG. 14B from that of the high-frequency output impedance matching circuit 1203 as shown in FIG. 12B.

This means that it is possible to use the capacitor 1202 having a small capacitance value because the effective reactance of the capacitor 1202 is increased by connecting the inductor 1401 to the capacitor 1202 in serial. Therefore, the high-frequency output impedance matching circuit 1203 is achieved, in which the circuit area of the capacitor 1202 is reduced.

In FIG. 14B, the same effect can be obtained if one end of the inductor 1401 is connected to the output terminal 1102, one end of the capacitor 1202 is connected to the ground and another end of the inductor 1401 is connected to another end of the capacitor 1202.

Next, a seventh embodiment according to the present invention will be explained.

Figure 15A:
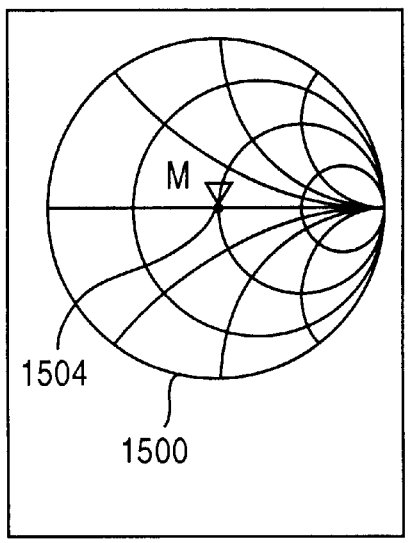
FIGS. 15A and 15B show an output impedance of the HPF-type high-frequency output impedance matching circuit according to the prior art connected to an output of the FET.
Figure 15B:
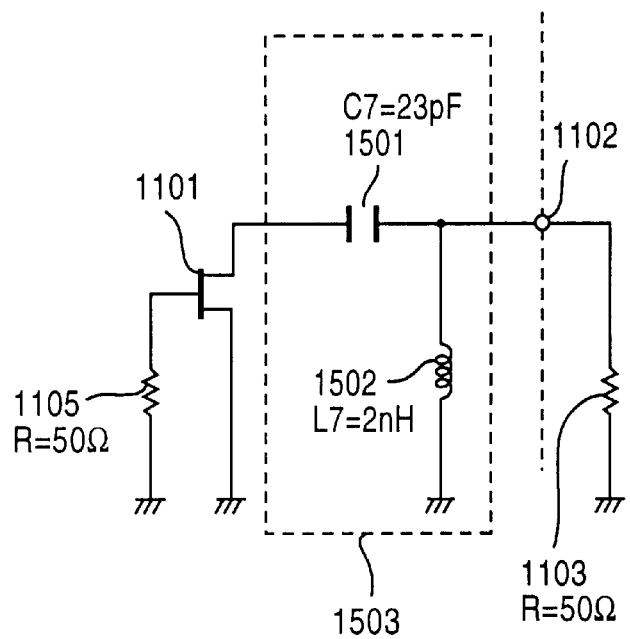

FIG. 15B shows the HPF-type high-frequency output impedance matching circuit 1503 according to the prior art, which is connected between a drain of the FET 1101 and the output terminal 1102. The position of the output impedance of the output terminal 1102 on the Smith chart moves from the point M 1104 as shown in FIG. 11A to the point M 1504 as shown in FIG. 15A, at which point M 1504 shows 50Ω on the Smith chart, when an inductance L7 of the inductor 1502 is set equal to 2 nH and a capacitance C7 of the capacitor 1501 is set equal to 23 pF in the output impedance matching circuit 1503, for example. This means that the output impedance of the FET 1101 can be matched to 50Ω by connecting the output impedance matching circuit 1503.

FIG. 16A shows an output impedance of the embodiment of the HPF-type high-frequency output impedance matching circuit 1503 as shown in FIG. 16B. In the HPF-type high-frequency output impedance matching circuit 1503 as shown in FIG. 16B, an inductor 1601 is connected to the capacitor 1501 in parallel as compared with the HPF-type high-frequency output impedance matching circuit 1503 as shown in FIG. 15B.

When the inductance LB of the inductor 1601 is selected to be 1.1 nH, the capacitance C7' of the capacitor 1501 is 46 pF to keep the parallel impedance of the capacitor 1501 having the capacitance C7' and the inductor 1601 having the inductance L8 equal to the impedance of the capacitor 1501 having the capacitance C7 of 23 pF.

The position of the point M 1602 on the Smith chart 1600 shows the output impedance of the output terminal 1102 of the high-frequency output impedance matching circuit 1503 as shown in FIG. 16B when the inductance L8 of the inductor 1601 is equal to 1.1 nH and the capacitance C7' of the capacitor 1501 is equal to 46 pF. A position where the point M 1602 is placed on the Smith chart 1600 and the position where the point M 1504 is placed on the Smith chart 1500 are the same. This means that the impedance of the point M 1602 and the impedance of the point M 1504 are the same. Therefore, it is possible to increase the capacitance of the capacitor 1501 from 23 pF to 46 pF by connecting the inductor 1601 to the capacitor 1501 in parallel without changing the output impedance of the output terminal 1102 of the high-frequency output impedance matching circuit 1503 as shown in FIG. 16B from that of the high-frequency input impedance matching circuit 1503 as shown in FIG. 15B.

This means that it is possible to use the capacitor 1501 having a large capacitance value because the effective reactance of the capacitor 1501 is reduced by connecting the inductor 1601 to the capacitor 1501 in parallel. Therefore, the high-frequency output impedance matching circuit 1503 is achieved, in which the fluctuation of the characteristics of the high-frequency circuit caused by the variation of the capacitance C7' of the capacitor 1501 is reduced.

Next, an eighth embodiment according to the present invention will be explained.

FIG. 17A shows an output impedance of the embodiment of the HPF-type high-frequency output impedance matching circuit as shown in FIG. 17B. In the HPF-type high-frequency output impedance matching circuit 1503 as shown in FIG. 17B, a capacitor 1701 is connected to the inductor 1502 in serial as compared with the HPF-type high-frequency output impedance matching circuit 1503 as shown in FIG. 15B.

When the capacitance C8 of the capacitor 1701 is selected to be 12.7 pF, the inductance L7' of the inductor 1502 is 4 nH to keep the serial impedance of the inductor 1502 having the inductance L7' and the capacitor 1701 having a capacitance C8 equal to the impedance of the inductor 1502 having the inductance L7 of 2 nH as shown in FIG. 15B.

The position of the point M 1702 on the Smith chart 1700 shows the output impedance of the output terminal 1102 of the high-frequency output impedance matching circuit 1503 as shown in FIG. 17B when the inductance L7' of the inductor 1502 is equal to 4 nH and the capacitance C8 of the capacitor 1701 is equal to 12.7 pF. A position where the point M 1702 is placed on the Smith chart 1700 as shown in FIG. 17A and the position where the point M 1504 is placed on the Smith chart 1500 as shown in FIG. 15A are the same. This means that the impedance of the point M 1702 and the impedance of the point M 1504 are the same. Therefore, it is possible to increase the inductance of the inductor 1502 from 2 nH to 4 nH by connecting the capacitor 1701 to the inductor 1502 in serial without changing the output impedance of the output terminal 1102 of the high-frequency output impedance matching circuit 1503 as shown in FIG. 17B from that of the high-frequency input impedance matching circuit 1503 as shown in FIG. 15B.

This means that it is possible to use the inductor 1502 having a large inductance value because the effective reactance of the inductor 1502 is reduced by connecting the capacitor 1701 to the inductor 1502 in serial. As a result, it is possible to place the low-loss inductor 1502 outside the chip. Therefore, the high-frequency output impedance matching circuit 1503 is achieved, in which the fluctuation of the characteristics of the high-frequency circuit caused by the variation of the inductance L7' of the inductor 1502 is reduced.

In FIG. 17B, the same effect can be obtained if one end of the inductor 1502 is connected to the output terminal 1102, one end of the capacitor 1701 is connected to the ground and another end of the inductor 1502 is connected to another end of the capacitor 1701.

Next, a ninth embodiment according to the present invention will be explained.

Figure 18:
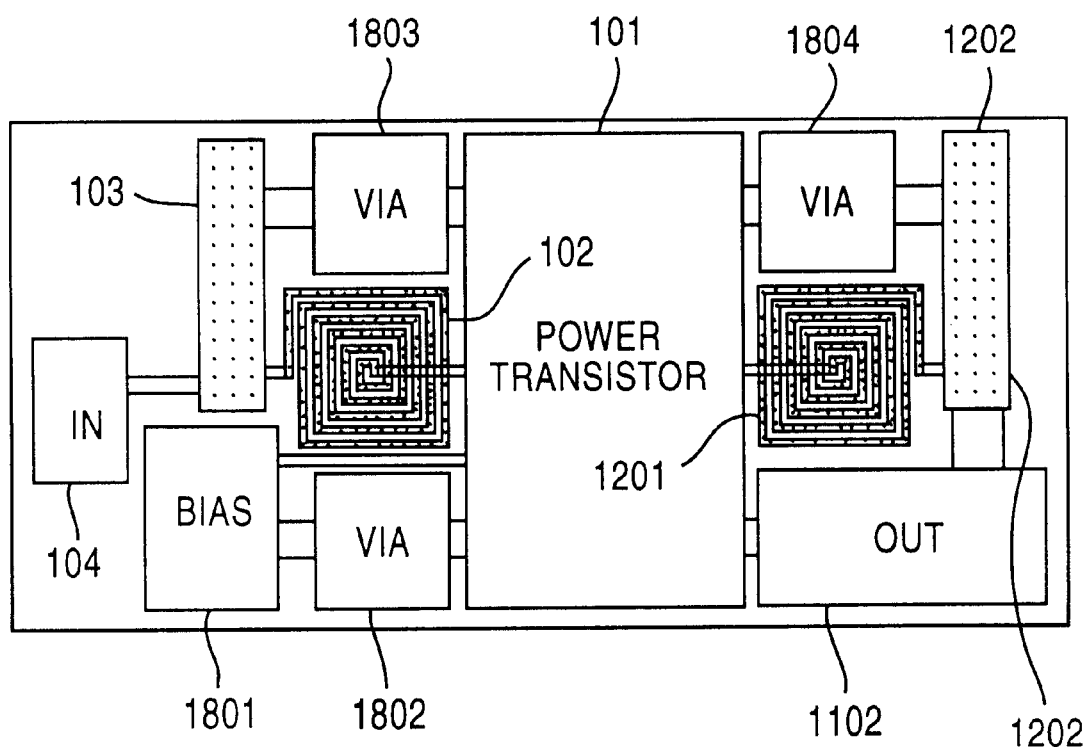
FIG. 18 shows an example of a semiconductor integrated circuit according to the prior art in which the LPF-type high-frequency input impedance matching circuit according to the prior art and the LPF-type high-frequency output impedance matching circuit according to the prior art are placed.
Figure 19:
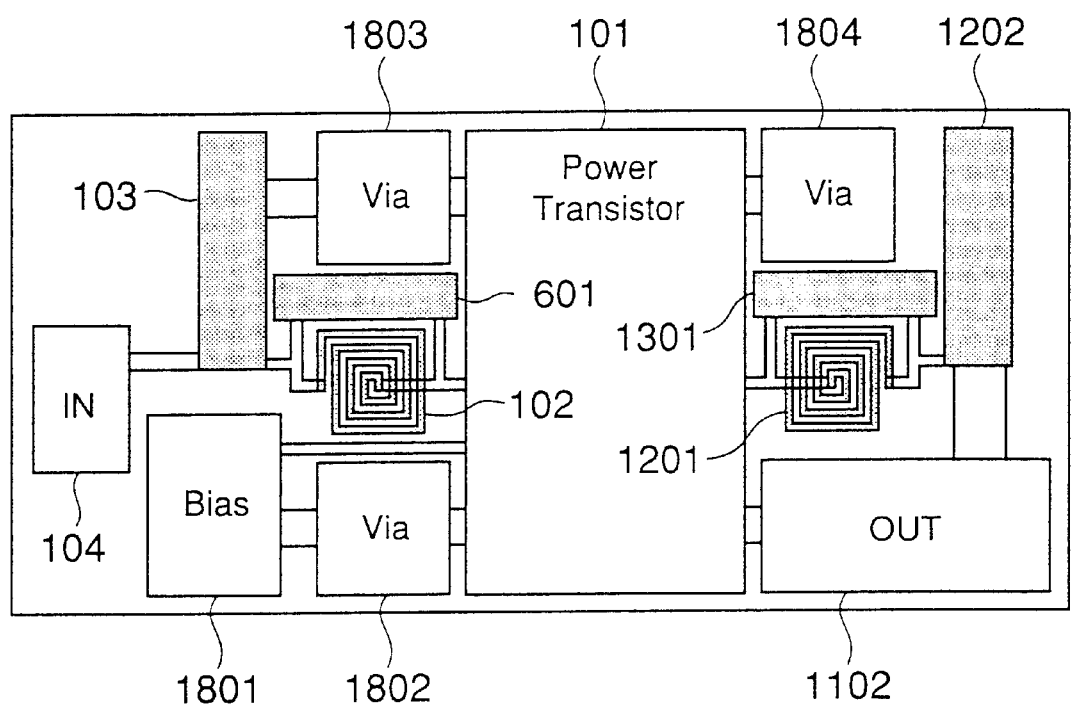
FIG. 19 shows an embodiment of a semiconductor integrated circuit according to the present invention in which the LPF-type high-frequency input impedance matching circuit according to the present invention and the LPF-type high-frequency output impedance matching circuit according to the present invention are placed.

FIG. 18 shows an example of a microwave monolithic integrated circuit (MMIC) according to the prior art in which the LPF-type high-frequency input impedance matching circuit according to the prior art and the LPF-type high-frequency output impedance matching circuit according to the prior art are placed. FIG. 19 shows an embodiment of an MMIC according to the present invention in which the LPF-type high-frequency input impedance matching circuit according to the present invention and the LPF-type high-frequency output impedance matching circuit according to the present invention are placed. The MMIC according to the prior art as shown in FIG. 18 has the FET 101, the LPF-type high-frequency input impedance matching circuit as shown in FIG. 5B including the input terminal 104, the inductor 102 and the capacitor 103, the LPF-type high-frequency output impedance matching circuit as shown in FIG. 12B including the output terminal 1102, the inductor 1201 and the capacitor 1202, a bias voltage circuit 1801 and connection terminals 1802, 1803 and 1804. The inductor 102 in the LPF-type high-frequency input impedance matching circuit is formed by a spiral inductor and the capacitor 103 is formed by, for example, a metal-insulator-metal (MIM) capacitor on the MMIC. The inductor 1201 in the LPF-type high-frequency output impedance matching circuit is formed by a spiral inductor and the capacitor 1202 is formed by, for example, an MIM capacitor on the MMIC.

On the other hand, the MMIC according to the present invention as shown in FIG. 19 has the LPF-type high-frequency input impedance matching circuit 105 as shown in FIG. 6B and the LPF-type high-frequency output impedance matching circuit 1203 as shown in FIG. 13B. In-the MMIC according to the present invention as shown in FIG. 19, the capacitor 601 is connected to the inductor 102 in parallel in the LPF-type high-frequency input impedance matching circuit 105 and the capacitor 1302 is connected to the inductor 1201 in parallel in the LPF-type high-frequency output impedance matching circuit 1203 as compared with the semiconductor integrated circuit according to the prior art as shown in FIG. 18.

Therefore, it is possible to reduce the size of the inductor 102 and the size of the inductor 1201 without changing the input impedance of the input terminal 104 of the high-frequency input impedance matching circuit 105 and the output impedance of the output terminal 1102 of the high-frequency output impedance matching circuit 1203 by connecting the capacitor 601 to the inductor 102 in parallel and connecting the capacitor 1301 to the inductor 1201 in parallel.

Next, a tenth embodiment according to the present invention will be explained.

Figure 20:
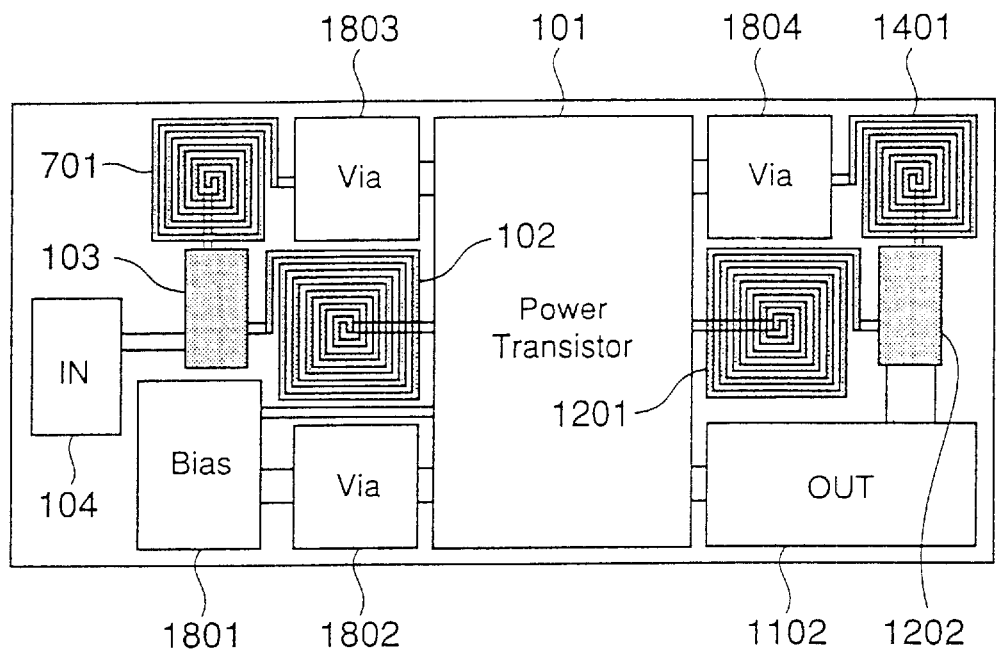
FIG. 20 shows another embodiment of a semiconductor integrated circuit according to the present invention in which the LPF-type high-frequency input impedance matching circuit according to the present invention and the LPF-type high-frequency output impedance matching circuit according to the present invention are placed.

FIG. 20 shows an embodiment of the MMIC according to the present invention in which the LPF-type high-frequency input impedance matching circuit according to the present invention and the LPF-type high-frequency output impedance matching circuit according to the present invention are placed.

The MMIC according to present invention as shown in FIG. 20 has the LPF-type high-frequency input impedance matching circuit 105 as shown in FIG. 7B and the LPF-type high-frequency output impedance matching circuit 1203 as shown in FIG. 14B. In the MMIC according to the present invention as shown in FIG. 20, the inductor 701 is connected to the capacitor 103 in serial in the LPF-type high-frequency input impedance matching circuit 105 and the inductor 1401 is connected to the capacitor 1202 in serial in the LPF-type high-frequency output impedance matching circuit 1203 as compared with the semiconductor integrated circuit according to the present invention as shown in FIG. 18.

Therefore, it is possible to reduce the size of the capacitor 103 and the size of the capacitor 1202 without changing the input impedance of the input terminal 104 of the high-frequency input impedance matching circuit 105 and the output impedance of the output terminal 1102 of the high-frequency output impedance matching circuit 1203 by connecting the inductor 701 to the capacitor 103 in serial and connecting the inductor 1401 to the capacitor 1202 in serial.

Furthermore, it is possible to provide the inductor outside the chip to reduce the area of the MMIC. The MMIC can have terminals to be connected to the inductor 701 and 1401 which are placed outside the MMIC.

Next, an eleventh embodiment according to the present invention will be explained.

Figure 21:
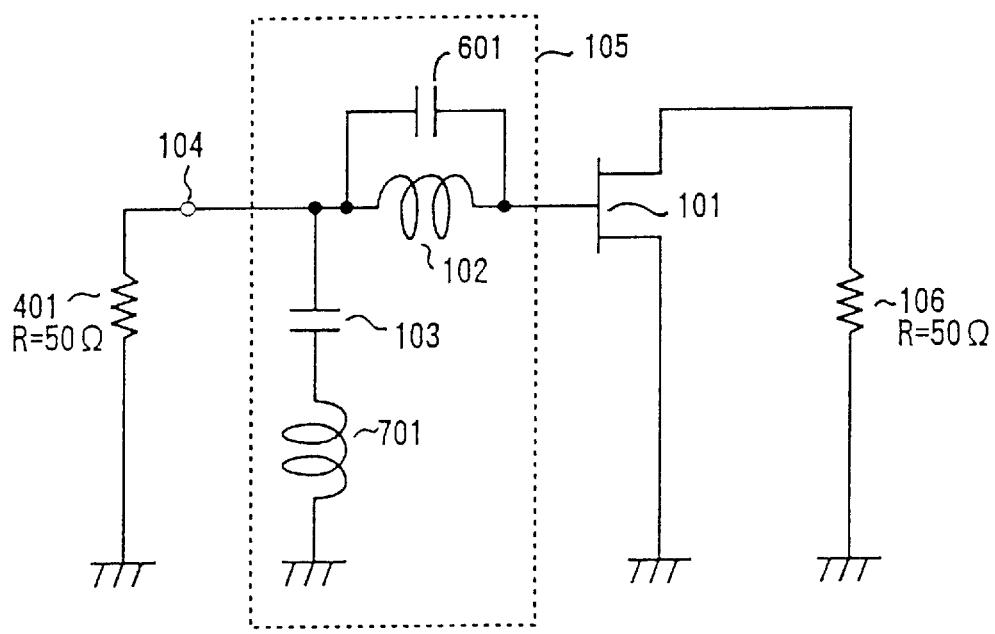
FIG. 21 shows an embodiment according to the present invention of the LPF-type high-frequency input impedance matching circuit connected to the input of the FET.

FIG. 21 shows the embodiment of the LPF-type high-frequency input impedance matching. In the LPF-type high-frequency input impedance matching circuit 105 as shown in FIG. 21, a capacitor 601 is connected to the inductor 102 in parallel and an inductor 701 is connected to the capacitor 103 in serial as compared with the LPF-type high-frequency input impedance matching circuit 105 as shown in FIG. 5B.

It is possible to use the inductor 102 having a small inductance value because the effective reactance of the inductor 102 is increased by connecting the capacitor 601 to the inductor 102 in parallel. Further, it is possible to use the capacitor 103 having a small capacitance value because the effective reactance of the capacitor 103 is increased by connecting the inductor 701 to the capacitor 103 in serial. As a result, the series resistance component of the inductor 102 can be reduced because the inductor having a short length can be used. Therefore, the high-frequency input impedance matching circuit 105 is achieved, in which the high-frequency power loss in the inductor 102 is reduced and an area of the capacitor 103 is reduced.

Next, a twelfth embodiment according to the present invention will be explained.

Figure 22:
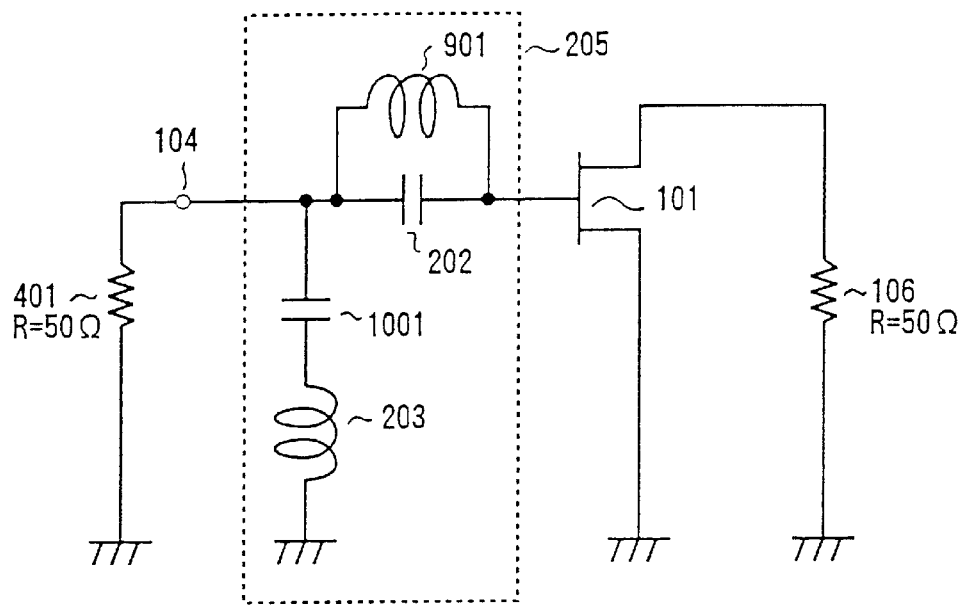
FIG. 22 shows an embodiment according to the present invention of the HPF-type high-frequency input impedance matching circuit connected to the input of the FET.

FIG. 22 shows an embodiment of the HPF-type high-frequency input impedance matching circuit. In the HPF-type high-frequency input impedance matching circuit 205 as shown in FIG. 22, the inductor 901 is connected to the capacitor 202 in parallel and the capacitor 1001 is connected to the inductor 203 in serial as compared with the HPF-type high-frequency input impedance matching circuit 205 as shown in FIG. 8B.

It is possible to use the capacitor 202 having a large capacitance value because the effective reactance of the capacitor 202 is reduced by connecting the inductor 901 to the capacitor 202 in parallel. Furthermore, it is possible to use the inductor 203 having a large inductance value because the effective reactance of the inductor 203 is reduced by connecting the capacitor 1001 to the inductor 203 in serial.

Therefore, the high-frequency input impedance matching circuit 205 is achieved, in which the fluctuation of the characteristics of the high-frequency circuit caused by the variation of the capacitance of the capacitor 202 is reduced. Furthermore, the fluctuation of the characteristics of the high-frequency circuit caused by the variation of the inductance of the inductor 203 is reduced because it is possible to place the low-loss inductor 203 outside the chip.

Next, a thirteenth embodiment according to the present invention will be explained.

Figure 23:
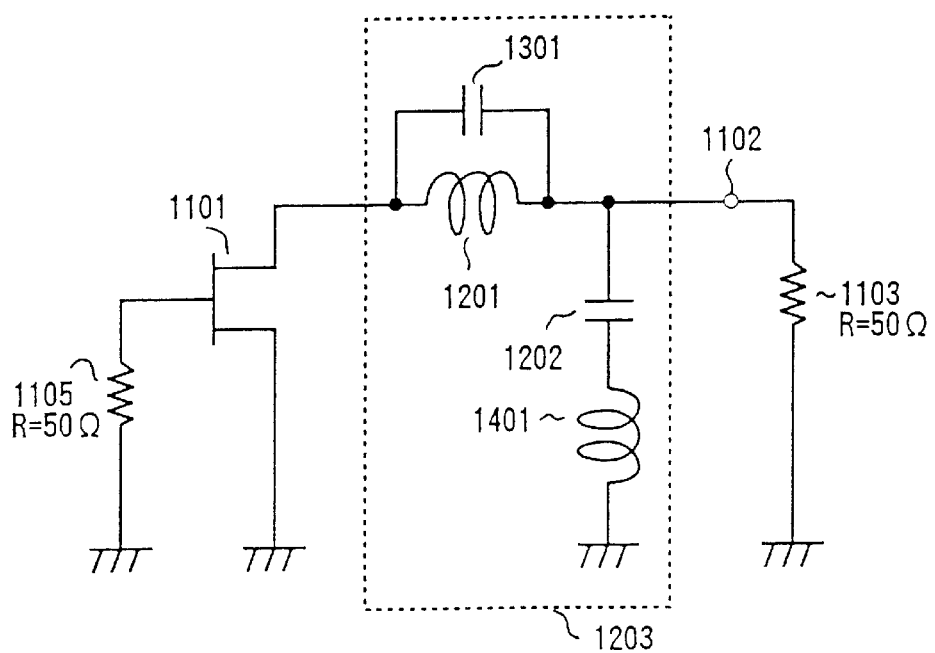
FIG. 23 shows an embodiment according to the present invention of the LPF-type high-frequency output impedance matching circuit connected to the output of the FET.

FIG. 23 shows an embodiment of the LPF-type high-frequency output impedance matching circuit.

In the LPF-type high-frequency output impedance matching circuit 1203 as shown in FIG. 23, the capacitor 1301 is connected to the inductor 1201 in parallel and the inductor 1401 is connected to the capacitor 1202 in serial as compared with the LPF-type high-frequency output impedance matching circuit 1203 as shown in FIG. 12B.

It is possible to use the inductor 1201 having a small inductance value because the effective reactance of the inductor 102 is increased by connecting the capacitor 1301 to the inductor 1201 in parallel. Furthermore, it is possible to use the capacitor 1202 having a small capacitance value because the effective reactance of the capacitor 1202 is increased by connecting the inductor 1401 to the capacitor 1202 in serial.

As a result, the series resistance component of the inductor 1201 can be reduced because the inductor having a short length can be used. Therefore, the high-frequency output impedance matching circuit 1203 is achieved, in which the high-frequency power loss in the inductor 1201 is reduced and the area of the capacitor 1202 is reduced.

Next, a fourteenth embodiment according to the present invention will be explained.

Figure 24:
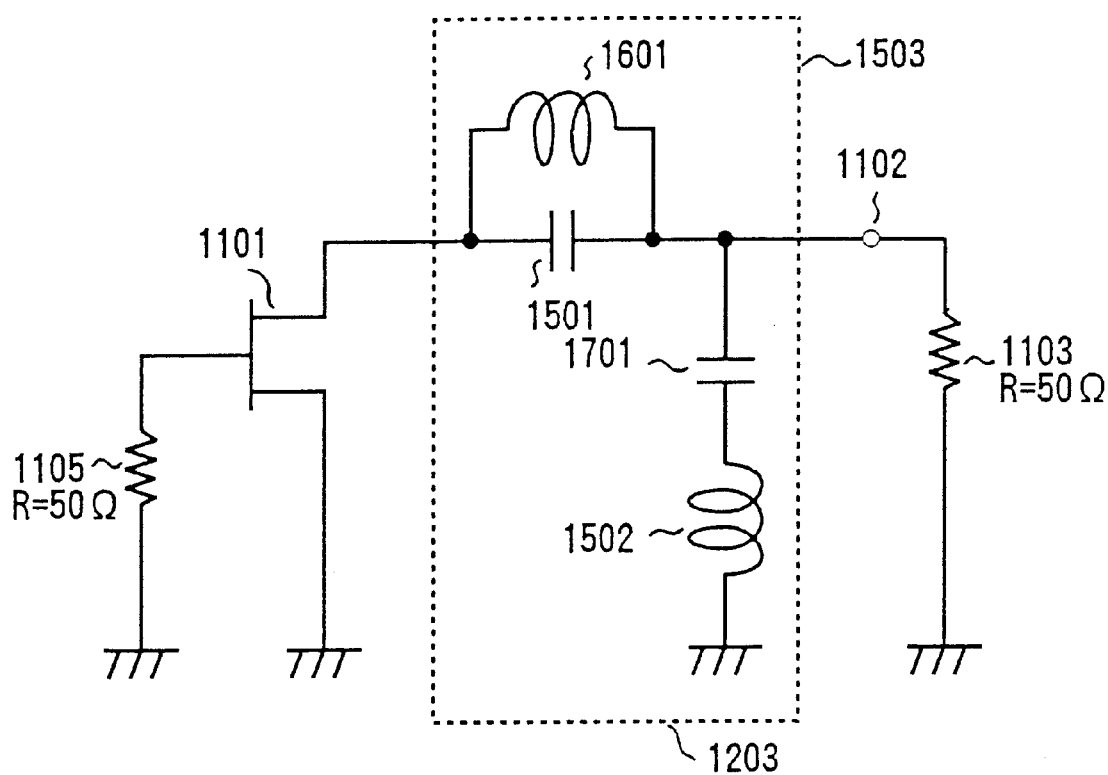
FIG. 24 shows an embodiment according to the present invention of the HPF-type high-frequency output impedance matching circuit connected to the output of the FET.

FIG. 24 shows an embodiment of the HPF-type high-frequency output impedance matching circuit. In the HPF-type high-frequency output impedance matching circuit 1503 as shown in FIG. 24, the inductor 1601 is connected to the capacitor 1501 in parallel and the capacitor 1701 is connected to the inductor 1502 in serial as compared with the HPF-type high-frequency output impedance matching circuit 1503 as shown in FIG. 15B.

It is possible to use the capacitor 1501 having a large capacitance value because the effective reactance of the capacitor 1501 is reduced by connecting the inductor 1601 to the capacitor 1501 in parallel. Furthermore, it is possible to use the inductor 1502 having a large inductance value because the effective reactance of the inductor 1502 is reduced by connecting the capacitor 1701 to the inductor 1502 in serial.

Therefore, the high-frequency output impedance matching circuit 1503 is achieved, in which the fluctuation of the characteristics of the high-frequency circuit caused by the variation of the capacitance of the capacitor 1501 is reduced. Furthermore, the fluctuation of the characteristics of the high-frequency circuit caused by the variation of the inductance of the inductor 1502 is reduced because it is possible to place the low-loss inductor 1502 outside the chip.

The present invention is not limited to the specifically disclosed embodiments, and variations and modifications may be made without departing from the scope of the present invention.

The present application is based on Japanese priority application No. 11-120625 filed on Apr. 27, 1999, the entire contents of which are hereby incorporated by reference.

What is claimed is:

1. A high-frequency input impedance matching circuit comprising:

a first capacitor connected between an input of a transistor and an input terminal of said high-frequency input impedance matching circuit; and an inductor and a second capacitor which are connected in serial between a junction of said first capacitor and said input terminal and a ground, wherein said second capacitor is not supplied a DC bias voltage.

2. A high-frequency output impedance matching circuit comprising:

a first capacitor connected between an output of a transistor and an output terminal of said high-frequency output impedance matching circuit; and an inductor and a second capacitor which are connected in serial between a junction of said first capacitor and said output terminal and a ground, wherein said second capacitor is not supplied a DC bias voltage.

3. A semiconductor integrated circuit comprising:

a circuit; and a high-frequency input impedance matching circuit including:

a first capacitor connected between an input of a transistor and an input terminal of said high-frequency input impedance matching circuit; and an inductor and a second capacitor which are connected in serial between a junction of said first capacitor and said input terminal and a ground, wherein said second capacitor is not supplied a DC bias voltage to said input of said transistor.

4. A semiconductor integrated circuit comprising:

a circuit; and a high-frequency output impedance matching circuit including:

a first capacitor connected between an output of a transistor and an output terminal of said high-frequency output impedance matching circuit; and an inductor and a second capacitor which are connected in serial between a junction of said first capacitor and said output terminal and a ground, wherein said second capacitor is not supplied a DC bias voltage to said output of said transistor.

* * * * *